(12) United States Patent
Kebabian

(10) Patent No.: US 8,364,430 B2
(45) Date of Patent: Jan. 29, 2013

(54) SYSTEM AND METHOD FOR PRECISION PHASE SHIFT MEASUREMENT

(75) Inventor: Paul L. Kebabian, Acton, MA (US)

(73) Assignee: Aerodyne Research, Inc., Billerica, MA (US)

( * ) Notice: Subject to any disclaimer, the term of this patent is extended or adjusted under 35 U.S.C. 154(b) by 509 days.

(21) Appl. No.: 12/434,419

(22) Filed: May 1, 2009

(65) Prior Publication Data

US 2010/0057390 A1 Mar. 4, 2010

Related U.S. Application Data

(60) Provisional application No. 61/092,257, filed on Aug. 27, 2008.

(51) Int. Cl.
  *G01R 25/00* (2006.01)
(52) U.S. Cl. .................. 702/72; 702/79; 324/76.12
(58) Field of Classification Search .............. 702/79, 702/72; 342/28; 324/76.12
  See application file for complete search history.

(56) References Cited

U.S. PATENT DOCUMENTS

| | | | |
|---|---|---|---|
| 3,675,136 A | | 7/1972 | O'Brien |
| 3,740,748 A | * | 6/1973 | Hose .............................. 342/194 |
| 3,845,412 A | * | 10/1974 | Rearwin et al. ................ 332/104 |
| 3,950,750 A | * | 4/1976 | Churchill et al. ............. 342/174 |
| 3,986,113 A | | 10/1976 | Vifian |
| 4,464,662 A | * | 8/1984 | Tomasi ........................... 342/87 |
| 4,980,899 A | * | 12/1990 | Troost et al. .................... 375/357 |
| 5,878,335 A | | 3/1999 | Kushner et al. |
| 7,126,324 B1 | * | 10/2006 | Goncharenko ............ 324/76.77 |

FOREIGN PATENT DOCUMENTS

GB 2085601 A 4/1982

OTHER PUBLICATIONS

Fowles, Grant; "Introduction to Modern Optics", 1968, Holt, Reinhart and Winston, Inc., pp. 70-75.*
Proakis et al.; "Fundamentals of Communication Systems"; 2005, Prentice Hall, pp. 154-155.*
"Notification of Transmittal of the International Search Report and the Written Opinion of the International Searching Authority, or the Declaration," International Filing Date: May 1, 2009, International Application No. PCT/US2009/002691, Applicant: Aerodyne Research, Inc., Date of Mailing: Aug. 26, 2009, pp. 1-14.

(Continued)

*Primary Examiner* — Jonathan C Teixeira Moffat
*Assistant Examiner* — Regis Betsch
(74) *Attorney, Agent, or Firm* — Cesari and McKenna, LLP

(57) ABSTRACT

In one embodiment, a frequency generator produces an excitation signal, a local oscillator signal, and a reference signal at a difference frequency of the excitation signal and local oscillator signal. The excitation signal is applied to a physical system to produce a response signal, which is mixed with the local oscillator signal. A filter selects a difference frequency component. The frequencies of the excitation signal and/or local oscillator signal are varied, such that the magnitude of the difference frequency is constant, but a sign of the difference frequency changes from positive to negative. The phase shift of the difference frequency component, with respect to the reference signal, at each of the two signs of the difference frequency, is measured. The measured phase shift at the negative sign is subtracted from the measured phase shift at the positive sign, and the difference is divided in half, to produce a result.

20 Claims, 9 Drawing Sheets

OTHER PUBLICATIONS

Allen, W.K., et al., "Traveling Wave Tube Re-Entrant Amplifier Serrodyne System," NASA Technical Note: NASA TN D-2149, National Aeronautics and Space Administration, Washington, D.C., Jun. 1964, pp. 1-23.

Sonnaillon, Maximiliano Osvaldo, et al., "A Low-Cost, High-Performance, Digital Signal Processor-Based Lock-In Amplifier Capable of Measuring Multiple Frequency Sweeps Simultaneously," American Institute of Physics, Review of Science Instruments 76, 024703, Jan. 20, 2005, pp. 1-7.

Restelli, A., et al., "Digital Field Programmable Gate Array-Based Lock-In Amplifier for High-Performance Photon Counting Applications,", American Institute of Physics, Review of Science Instruments 76, 093112, Sep. 12, 2005, pp. 1-8.

Cumming, Raymond C., "The Serrodyne Frequency Translator," Proceedings of the IRE, vol. 45, Issue 2, Feb. 1957, pp. 175-186, Digital Object Identifier 10.1109/JRPROC.1957.278387, pp. 1-12.

* cited by examiner

SYSTEM AND METHOD FOR PRECISION PHASE SHIFT MEASUREMENT

RELATED APPLICATIONS

This application claims priority to U.S. Provisional Patent Application No. 61/092,257, filed on Aug. 27, 2008 by Paul L. Kebabian, the contents of which are hereby incorporated by reference in their entirety.

BACKGROUND

1. Technical Field

The present invention relates generally to precision measurement, and more specifically to precision measurement of a phase shift in a periodically excited physical system.

2. Background

There is often a need to make precise measurements of a phase shift in a periodically excited physical system. Such measurements are of interest because the phase shift between excitation and response often provides a sensitive way to measure some property of the physical system, such as its resonant frequency or damping constant, which in turn varies with a quantity to be monitored in the environment, such as temperature or chemical composition.

For example, the physical system can be an optical resonant cavity formed by two opposed, high reflectivity mirrors. The excitation may be the intensity of a modulated incoherent light source that illuminates one of the mirrors; the response may be the intensity of modulated light that leaks out of the cavity. In such case the phase shift between the modulation of the excitation and the modulation of the response varies with photon lifetime within the resonant cavity. That is, it varies with a damping constant, which in turn varies with optical losses caused by the presence of an optically absorptive chemical species in the gas filling the cavity. Such technique may be used to sense the presence of a variety of compounds. For example, if the light has a wavelength in the 440 nm spectral region, optical absorption by nitrogen dioxide may be sensed in this way.

In a further example, the physical system may be a piezoelectric quartz crystal resonator. The excitation may be applied voltage; the response may be resulting current. In such case the phase shift between current and voltage varies with changes in resonance frequency, which in turn varies in response to a factor, such as temperature or mass deposition onto the surface.

In many practical situations, the combination of high excitation frequency and low response intensity make it unfeasible to directly measure the phase shift between response and excitation. In these cases, heterodyne detection has typically been employed to allow the measurement to be made at a lower frequency.

However, some amplification of the response usually is required before the actual phase shift measurement can be performed. This amplification creates problems, in that it generally causes an additional phase shift that must be distinguished from the phase shift caused by the physical system under study.

Accordingly, there is a need for an improved technique for precision measurement of a phase shift in a periodically excited physical system, which is not affected by these shortcomings.

SUMMARY

In one embodiment, a heterodyne phase shift measurement system includes a frequency generator that produces an excitation signal, a local oscillator signal that is coherent with the excitation signal, and a reference signal at a difference frequency of the excitation signal and local oscillator signal, which is coherent with the excitation signal and the local oscillator signal. The excitation signal is applied to a physical system to produce a response signal, which is, in turn, mixed by a mixer with a local oscillator signal, to produce an output signal. A filter, for example, of an amplifier, selects a difference frequency component of the output signal. Under the control of, for example, a computational element, the frequency generator varies the frequencies of the excitation signal and/or the local oscillator signal, such that the magnitude of the difference frequency component is constant, but a sign of the difference frequency component changes from positive to negative. The phase shift of the difference frequency component of the output signal, with respect to the reference signal, at each of the two signs of the difference frequency component, is measured. The measured phase shift at the negative sign is subtracted from the measured phase shift at the positive sign, and the difference is then divided in half, to produce a phase shift result. In such manner, the phase shift caused by the physical system may be measured substantially independent of any phase shifts caused by other components in the heterodyne phase shift measurement system, for example, by circuit components of downstream of the mixer.

BRIEF DESCRIPTION OF THE DRAWINGS

The description below refers to the accompanying drawings, of which.

DETAILED DESCRIPTION OF ILLUSTRATIVE EMBODIMENTS

Figure 1:
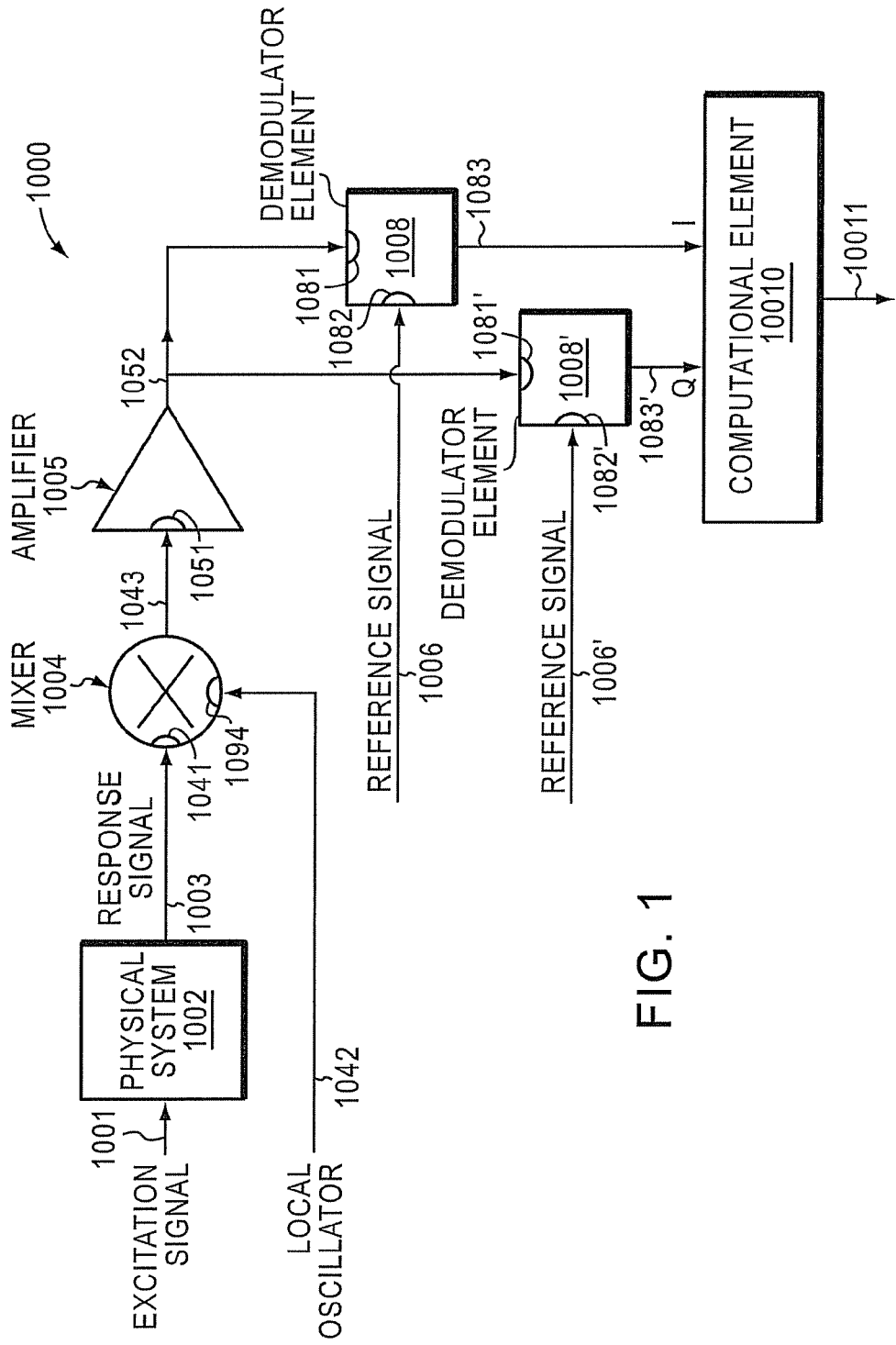
FIG. 1 is a schematic diagram of an example heterodyne phase shift measurement system.

FIG. 1 is a schematic diagram of an example heterodyne phase shift measurement system 1000. A periodic excitation signal 1001, at excitation frequency, $f_x$, is supplied to the input port of the physical system 1002 under study. The response signal 1003 then goes to one 1041 of two input ports of a mixer 1004, the other input port 1044 receiving local oscillator signal 1042, at local oscillator frequency, $f_{lo}$. The output signal 1043 of the mixer 1004 goes to the input port 1051 of the amplifier 1005, the output signal 1052 of which goes to the input ports 1081, 1081' of demodulator elements 1008, 1008'. These also have reference input ports 1082, 1082' to which reference signals 1006, 1006', respectively, are supplied. These reference signals are at the excitation frequency, $f_r$, and, in the simplest case, are sine and cosine waveforms, respectively. The demodulator elements 1008, 1008' multiply the output signal 1052 by these reference signal waveforms 1006, 1006' and integrate (or otherwise low-pass filter) the products, which are reported as in-phase, I, and quadrature, Q, outputs 1083, 1083'. Note that the demodulator elements 1008, 1008' usually are not directly implemented, but work in conjunction with a computational element 10010 (i.e., a microcontroller, a processor, or other collection of digital logic circuits capable of performing mathematical computation and/or generating control signals) to accomplish an equivalent operation and produce output 10011.

Many realizations of the demodulator elements 1008, 1008' are possible, and the present techniques can be used with a wide range of different demodulators. Accordingly, the following description of two possible demodulators is intended only as illustrative examples. In both examples, the output signal 1052 of the amplifier 1005 is assumed to have been converted to a variable-frequency pulse train by a voltage-to-frequency converter (not shown).

Note also, that the actual form of the signals may vary throughout the course of the signal processing. For example the input signal 1001 could originate as a logical state, which is transduced to light intensity for the excitation of the physical system 1002, the light leaving the physical system may be transduced to current for use by the mixer 1004, the current from which, after amplification, is transduced to the frequency of a variable frequency pulse train for input to demodulator elements 1008 and 1008'. In the interest of brevity, these transduction operations will not be discussed explicitly below as they are well known in the art, except where discussion is essential to avoid ambiguity.

The mixer 1004 may operate by multiplying its two input signals 1003, 1042. Thus, if the inputs are sinusoids, the output of the mixer 1004 has frequency components at frequencies $f_x+f_{lo}$ and $f_x-f_{lo}$, or sum and difference frequency components respectively. The difference frequency component is also known by the names, intermediate frequency, IF, and reference frequency, $f_r$, the latter of which will be used in some places below. The difference frequency is used for subsequent processing, so, amplifier 1005 includes a filter for low pass filtering the output signal 1043 of the mixer 1004 to select the difference frequency output of the mixer and reject the sum frequency output of the mixer.

In many cases of interest, the excitation signal 1001, at $f_x$, and local oscillator signal 1042, at frequency $f_{lo}$, are actually square waves. The reason for this is that square waves can typically be generated by digital logic elements having rise times and delay times in the nanosecond range, as compared to a typical period of the excitation, $1/f_x$, around 100 microseconds or longer. Thus, unwanted phase shifts arising from the generation of those signals is often of the order of $<10^{-5}$ of a cycle, ~13 arcseconds, and the instability of that angle is typically even smaller. In contrast, if the signals 1001, 1042 were sinusoids, their generation typically would have entailed amplification and filtering operations in which it would be difficult to achieve that low level of phase shift, and which would be subject to instability due, in particular, to temperature instability.

If the excitation signal 1001 and the local oscillator signal 1042 are square waves, the output of the mixer 1004 will, in general, have additional frequency components at $3(f_x-f_{lo})$, $5(f_x-f_{lo})$, etc., and the amplifier 1005 may incorporate further filtering to suppress these. Furthermore, in order to measure a phase shift, frequencies $f_r$, $f_x$, and $f_{lo}$ should be coherent, i.e., during a complete cycle of $f_r$, both $f_x$ and $f_{lo}$ should also have an integer number of complete cycles.

Figure 2:
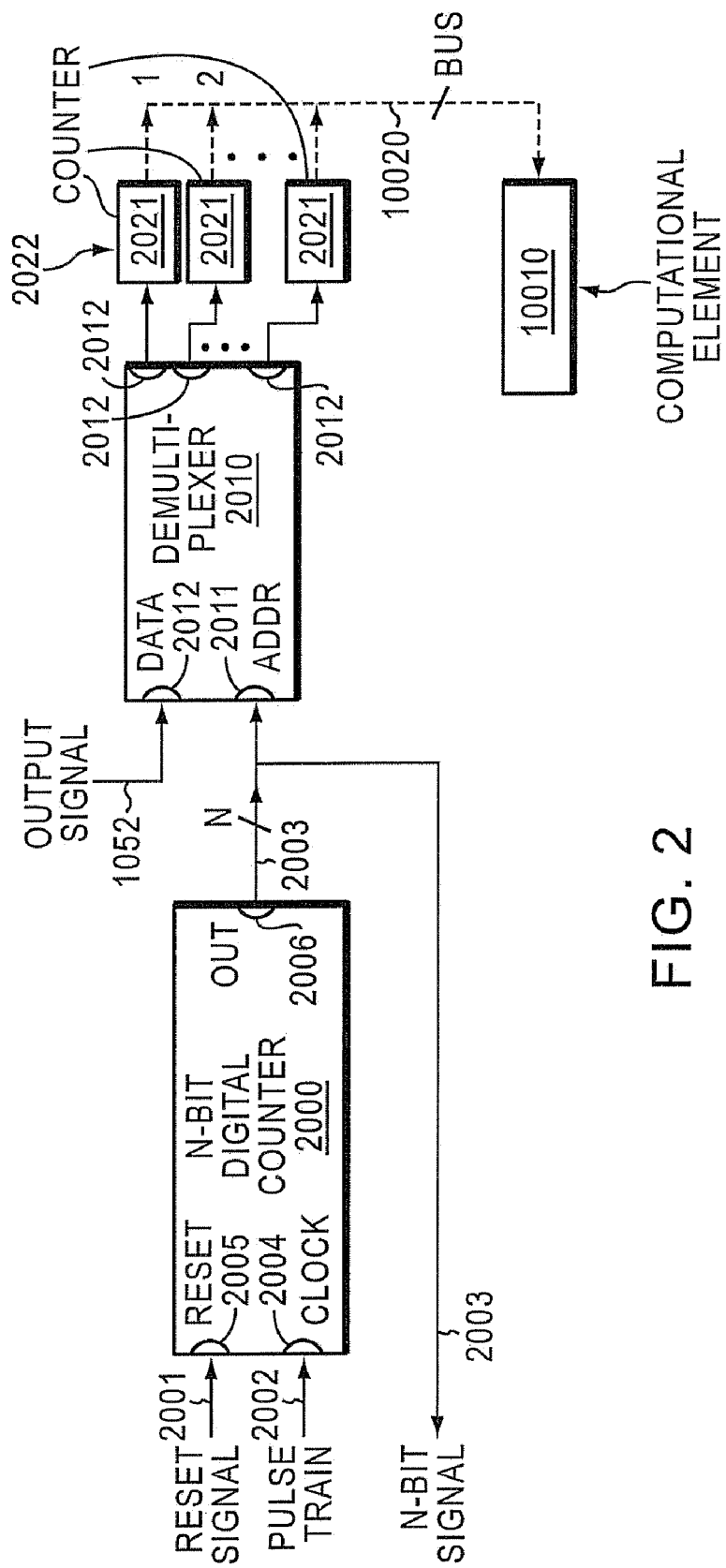
FIG. 2 is a schematic diagram showing a first example implementation of a demodulator element suitable for use in the phase shift measurement system of FIG. 1.

FIG. 2 is a schematic diagram showing a first example implementation of a demodulator element suitable for use as one of the demodulator elements 1008 and 1008' in the phase shift measurement system of FIG. 1. An N-bit digital counter 2000 (for example, N=4) receives a pulse train 2002 at frequency $2^N f_r$ on clock port 2004, that serves as a clock pulse. During each cycle at frequency $f_r$, an N-bit output signal 2003 supplied on output port 2006 steps through all $2^N$ possible values. The N-bit digital counter 2000 further may periodically receive a reset signal 2001 on reset port 2005. The N-bit output signal 2001 of the N-bit digital counter 2000 is supplied to an address port 2011 of a demultiplexer 2010, which further receives the output signal 1052 (in the form of a pulse train), on a data port 2012, wherein the signal 1052 is the output of the amplifier 1005 of FIG. 1 subject to a voltage-to-frequency converter (not shown). The output signal 1052 is transmitted, according to the address, to one of $2^N$ output ports 2012, each of which is connected to a counter 2021 in a counter array 2022 having $2^N$ counters. After accumulating the pulse train output signal 1052 for a prescribed number of cycles of $f_r$, the contents of these counters 2021 are read by computational element 10010, connected to the counter array 2022 by a bus 10020. The computational element 10010 then, for example, multiplies the readings by the weights shown in Table 1 (below) (for the case of N=4), and sums the results columnwise. Those sums are the in-phase, I, and quadrature, Q, values, and the gross phase shift may be found as $v=\arctan(Q/I)$. It is readily seen that by choice of the weights, the response to selected harmonics of $f_r$ can be made zero; for example, the weights given in Table 1 result in zero response to frequencies $3 f_r$, $5 f_r$, and $7 f_r$.

Optionally, counter 2000 also receives as input a reset signal pulse train 2001 at frequency $f_r$, that resets it to a zero state (all output bits cleared) when the local oscillator signal 1042 and excitation signals are in phase, i.e. both experience a transition at the same instant, which happens once each difference frequency cycle. Alternatively, the N-bit signal 2003 can be used to actively establish the instantaneous phase of the local oscillator or excitation signals. This is discussed further below.

TABLE 1

Example Weights applied to counters 1021 in counter array 2022, to evaluate I and Q

| Source Counter | Destination | |
|---|---|---|
| | I | Q |
| 1 | W1 | W4 |
| 2 | W2 | W3 |
| 3 | W3 | W2 |
| 4 | W4 | W1 |
| 5 | −W4 | W1 |
| 6 | −W3 | W2 |
| 7 | −W2 | W3 |
| 8 | −W1 | W4 |
| 9 | −W1 | −W4 |
| 10 | −W2 | −W3 |
| 11 | −W3 | −W2 |
| 12 | −W4 | −W1 |

TABLE 1-continued

Example Weights applied to counters 1021 in counter array 2022, to evaluate I and Q

| Source Counter | Destination | |
| --- | --- | --- |
| | I | Q |
| 13 | W4 | −W1 |
| 14 | W3 | −W2 |
| 15 | W2 | −W3 |
| 16 | W1 | −W4 |

W1 = 1.0
W2 = 0.84775907
W3 = 0.56645450
W4 = 0.19891237

Figure 3:
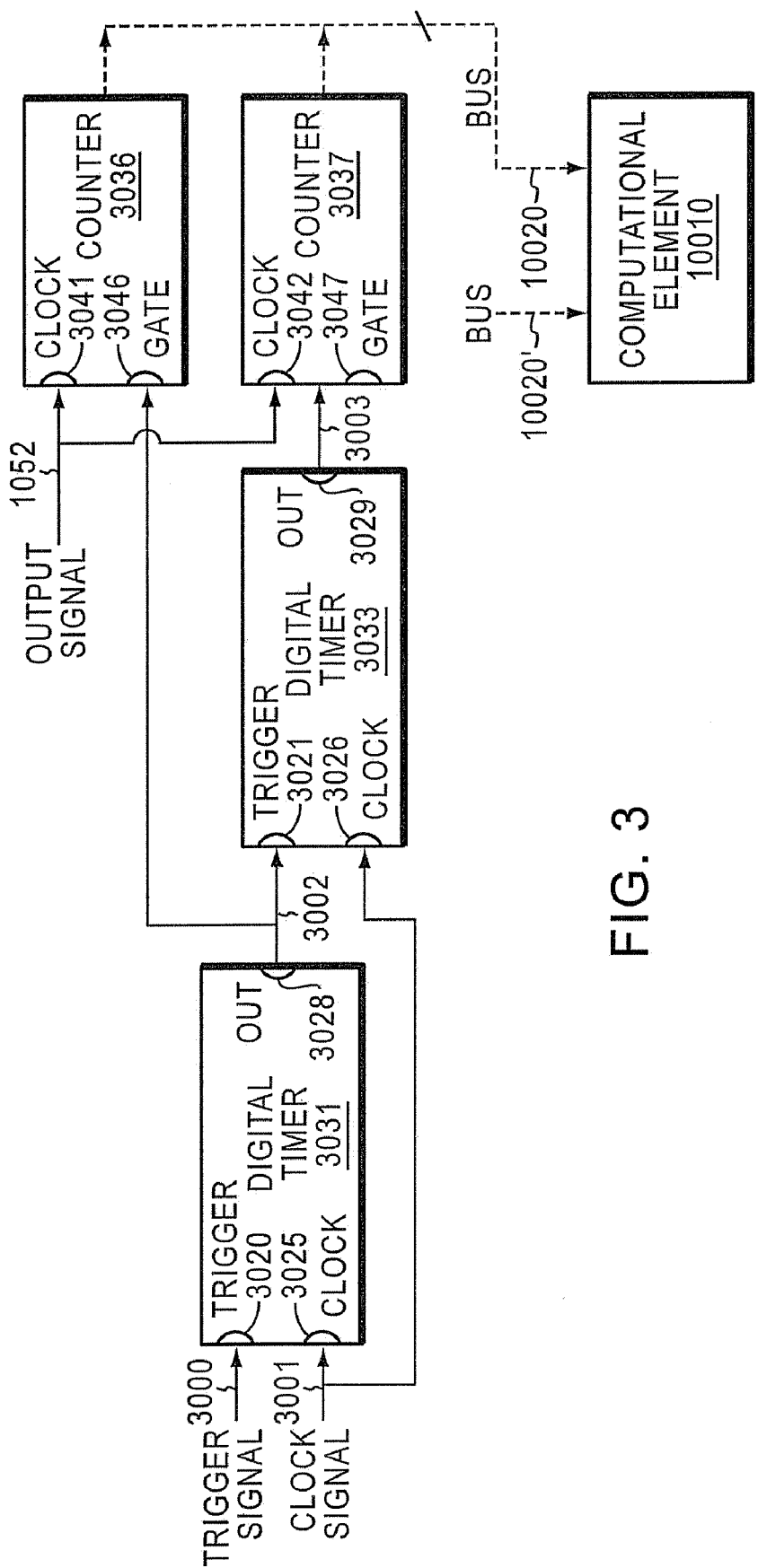
FIG. 3 is a schematic diagram showing a second example implementation of a demodulator element suitable for use in the phase shift measurement system of FIG. 1.

FIG. 3 is a schematic diagram showing a second example implementation of a demodulator element suitable for use as one of the demodulator elements 1008 and 1008' in the phase shift measurement system of FIG. 1. Digital timers 3031, 3033 receive a trigger signals on trigger ports 3020, 3021, and a clock signal 3001, on clock ports 3025, 3026, and produce output signals 3002, 3003 on output ports, 3028, 3029, respectively. When triggered by the falling edge of the trigger signal, the output signal is held low for $N_1$ clock pulses, then goes high for $N_2$ clock pulses, then goes low again. This functionality is available from, for example, AM9513A/AM9513 counter circuits originally manufactured by Advanced Micro Devices, Sunnyvale, Calif. Note that digital timer 3033 is triggered by the end (falling edge) of the output pulse from digital timer 3031. These output pulses of output signals 3002, 3003 are supplied as gate inputs to gate ports 3046, 3047 of two further counters, a first counter 3036 being controlled by digital timer 3031, and a second counter 3037 by digital timer 3033. These counters 3036, 3037 receive as their clock inputs, on clock ports 3041, 3042, the output signal 1052 (in the form of a pulse train) obtained, for example, from the voltage-to-frequency converter (not shown) associated with amplifier 1005. When the gate input is high, these pulses are counted, and when the gate input is low, they are ignored. They may be read out by the computational element 10010 over bus 10020, and a duplicate of the above components (not shown) may similarly be read out over bus 10020'.

Figure 4:
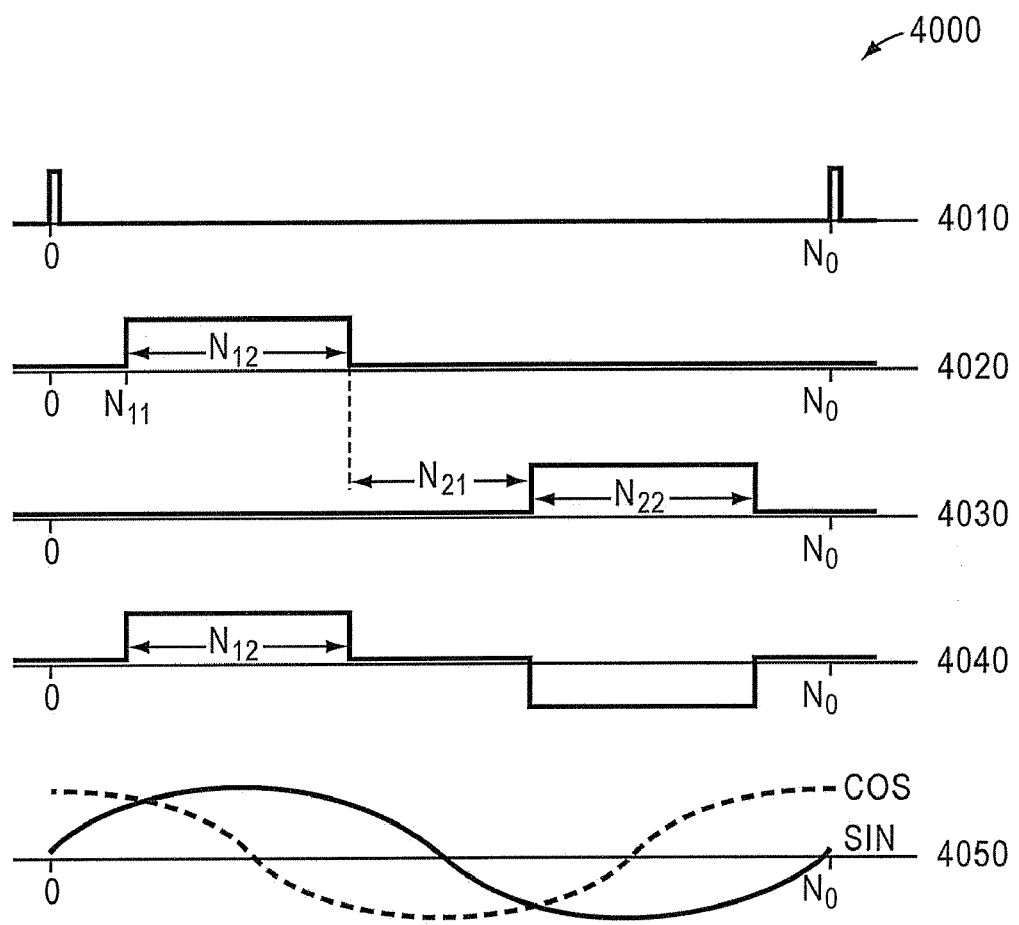
FIG. 4 is an example timing diagram for the example demodulator element of FIG. 3.

FIG. 4 is an example timing diagram 4000 of the demodulator element of FIG. 3. The clock signal 3001 that goes to digital timer 3031 is a multiple, No, of the reference frequency $f_r$, and therefore the time axis is scaled as 0 to No. Trace 4010 is the trigger pulse train 3000. Trace 4020 is the output 3002 of the first digital timers 3031, with low time and high time designated as $N_{11}$ and $N_{12}$, respectively. Trace 4030 is the output 3003 of the second digital timers 3033, with low and high durations $N_{21}$ and $N_{22}$. These are the gate signals for the two counters 3036, 3037, respectively, and the computational element 10010 may assign these weights of +1 and −1, respectively. Thus, the combination of these waveforms and the computation is equivalent to the reference waveform shown in trace 4040. Trace 4050 shows sine and cosine waves, and thus defines the zero point of the phase angle measurement. Observe that by making $N_{11}=N_0/12$, $N_{21}=N_0/6$, and $N_{12}=N_{22}=N_0/3$, the reference waveform will have the symmetry of the sine wave, and the response to an input of the cosine wave will be zero. Thus, the waveform 4040 is an approximation to a sine wave, and the elements shown in FIG. 3 together with the specified computation, constitute a realization of the demodulator element 1008' shown in FIG. 1. In similar manner, changing $N_{11}$ to $N_0/3$, demodulator element 1008 shown in FIG. 1 is realized. Further, the N values given above result in zero response to signals at $3f_r$.

Novel techniques may be employed in conjunction with a system similar to that described above to measure the phase shift caused by the physical system 1002 independent of phase shifts from other components, for example, to measure the phase shift caused by the physical system 1002 substantially free from any phase shift introduced by the amplifier 1005 or other circuit components downstream of the mixer 1004. Such techniques involves varying (e.g., adjusting) the frequency $f_x$ of the excitation signal 1001 and/or frequency $f_{lo}$ of the local oscillator signal 1042, such that the magnitude of a difference frequency (reference frequency) $f_x-f_{lo}$ is constant, but the sign of the difference frequency changes from positive to negative. The phase shift of the difference frequency (reference frequency) $f_x-f_{lo}$ is measured with respect to the reference signal 1006 at each of two signs of the difference frequency. The measured phase shift at the negative sign is subtracted from the measured phase shift at the positive sign, and then divided in half to yield a phase shift result. Such measured phase shift, due to cancellation of terms, is substantially free from any additional phase shift caused by the amplifier 1005 or other circuit components downstream of the mixer 1004.

Figure 5A:
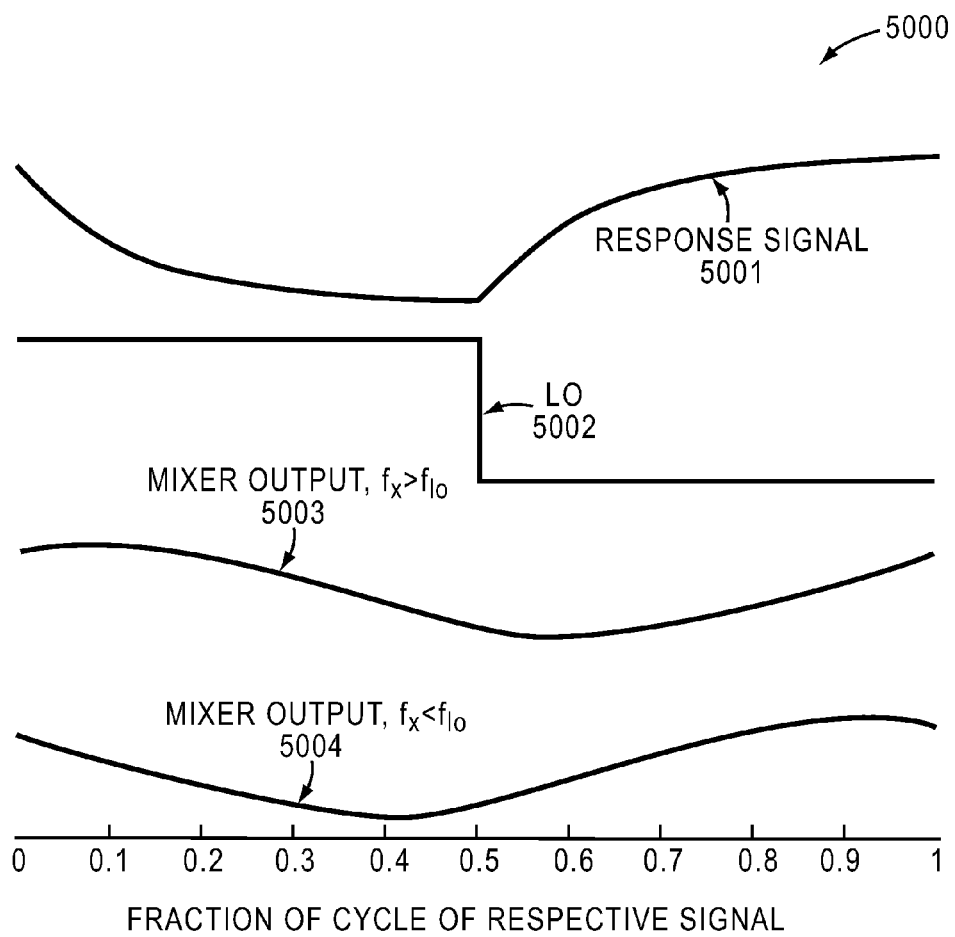
FIG. 5A is a depiction of representative waveforms involved in an example heterodyne phase shift measurement using the heterodyne phase shift measurement system of FIG. 1.

FIG. 5A is a depiction 5000 of representative waveforms involved in an example heterodyne phase shift measurement using the heterodyne phase shift measurement system of FIG. 1. An example response signal 1003 from the physical system 1002, at frequency $f_x$, is depicted as signal 5001 and an example local oscillator signal 1042 is depicted as signals 5002. As noted above, the local oscillator signal 1042 may be a square wave, as may be the excitation signal 1001, and the response signal 1003 from the physical system 1002 may be a filtered version of the excitation signal. At any instant, the output signal 1052 of the amplifier 1005 is the average of the product of the response signal 5001 and the local oscillator signal 5002, where the time offset dT between the response signal and local oscillator gradually evolves from cycle to cycle, because $f_x \neq f_{lo}$. Note that in typical applications, $f_r \ll f_x$, $f_{lo}$. This means that the output signal is the convolution of the response signal 5001 and a square pulse signal of width substantially equal to ½ $f_x$, with the time dependence scaled by $f_x/f_r$. Because of this convolution relationship, the output signal can also be described as signal 5001 filtered by an impulse response that is a square pulse of duration ½ $f_x$. Note that when $f_{lo} < f_x$, the positive state of the local oscillator signal 5002 occurs slightly later with respect to the response signal 5001, with each passing cycle of the excitation. Thus, the example output signal 5003 is a temporally scaled version of the filtered signal 5001, as described above. When $f_{lo} > f_x$, however, the output signal is not only temporally scaled, but also time reversed. The time reversed case is depicted in signal 5004. Note, that the waveforms in FIG. 5A are plotted versus fraction of a cycle, and the actual time scale for waveforms 5001 and 5002 is typically much shorter than for 5003 and 5004. The vertical plotting is in arbitrary units.

Each of the waveforms 5003, 5004 is represented by a Fourier series consisting of terms of the form $A_n \sin(n 2\pi f_r t) + B_n \cos(n 2\pi f_r t)$. For the time-reversed waveform, −t replaces t in these terms, which is equivalent to replacing $A_n$ by $-A_n$ while leaving the $B_n$ terms unchanged. Since the phase shift is $\Theta = \arctan(A_1/B_1)$, it is seen that changing from $f_{lo} < f_x$ to $f_{lo} > f_x$, with $|f_{lo}-f_x|$ unchanged, the phase shift reverses in sign. This change can be done without changing $f_r$, and thus any contribution of the parts of the signal path downstream of the mixer 1004 is unchanged. Since phase shift is an additive quantity, the following novel operations may be performed:

i) measure the gross phase shift between the difference frequency output and the reference signal with $f_{lo} < f_x$.

ii) measure the gross phase shift with $f_{lo} > f_x$ between the difference frequency output and the reference signal, keeping $|f_{lo} - f_x|$ the same as in step (i).

iii) take half of the difference between these measurements.

As a result of these operations, any additional phase shift contributed by the amplifier 1005 or other circuit components downstream of the mixer 1004 is cancelled.

Figure 5B:
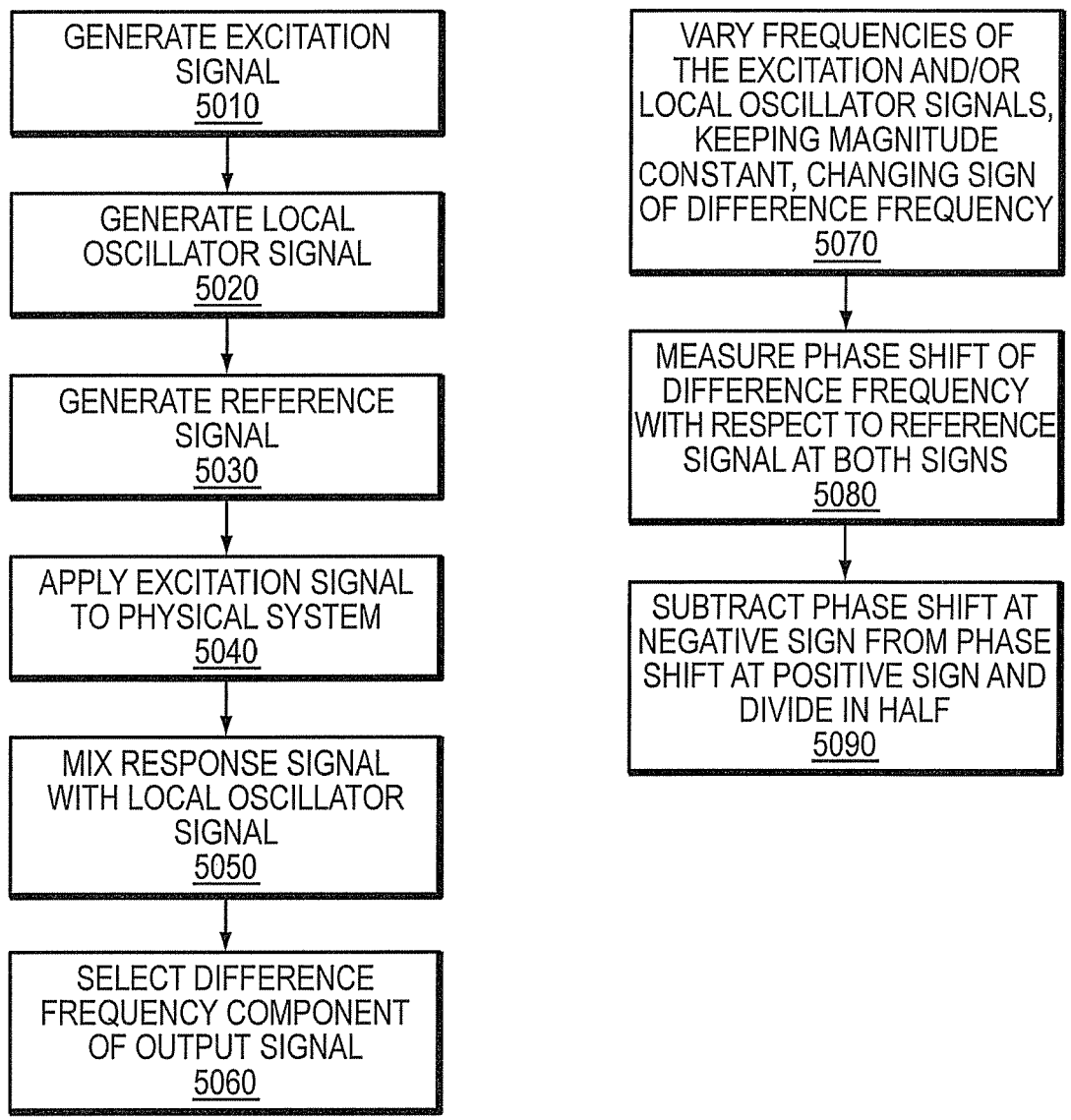
FIG. 5B is an example sequence of steps for precise heterodyne phase shift measurement.

FIG. 5B depicts an example sequence of steps for precise heterodyne phase shift measurement. At step 5010, an excitation signal 1001 is generated. At step 5020, a local oscillator signal 1042 that is coherent with the excitation signal 1001 is generated. At step 5030, a reference signal 1006 at a difference frequency of the excitation signal 1001 and the local oscillator signal 1042 is generated. Such reference signal 1006 is coherent with both the excitation signal and the local oscillator signal. At step 5040, the excitation signal 1040 is applied to the physical system 1002 to produce a response signal 1003. At step 5050, the response signal 1003 is mixed, e.g., at a mixer 1004 with the local oscillator signal 1042 to produce an output signal 1043. At step 5060, the difference frequency component of the output signal 1043 from the mixer is selected and used as an output signal 1052. At step 5070, which repeats with steps 5010 to 5050, the frequencies of the excitation signal and/or the local oscillator signal are varied (e.g., adjusted), such that the magnitude of the difference frequency is constant, but a sign of the difference frequency changes from positive to negative. Such varying may be accomplished under the direction of the computational element 10011. At step 5080, the phase shift of the difference frequency component with respect to the reference signal at each of the two signs of the difference frequency is measured. Finally, at step 5090 the measured phase shift at the negative sign is subtracted from the measured phase shift at the positive sign, and divided in half, to produce a phase shift result.

Embodiment 1

According to the above described novel technique, to precisely measure a phase shift in a periodically excited physical system 1002, it is desired to generate mutually coherent signals with frequencies $f_r$, $f_x$, and $f_{lo}$, as well as change the sign, but not the magnitude, of the difference frequency (reference frequency) $f_r = f_x - f_{lo}$. One direct way to accomplish the sign change is to interchange lines carrying the excitation and local oscillator signals 1001, 1042. This is the preferred embodiment for those applications where the phase shift of the physical system 1002 under study is not sharply resonant.

Figure 6:
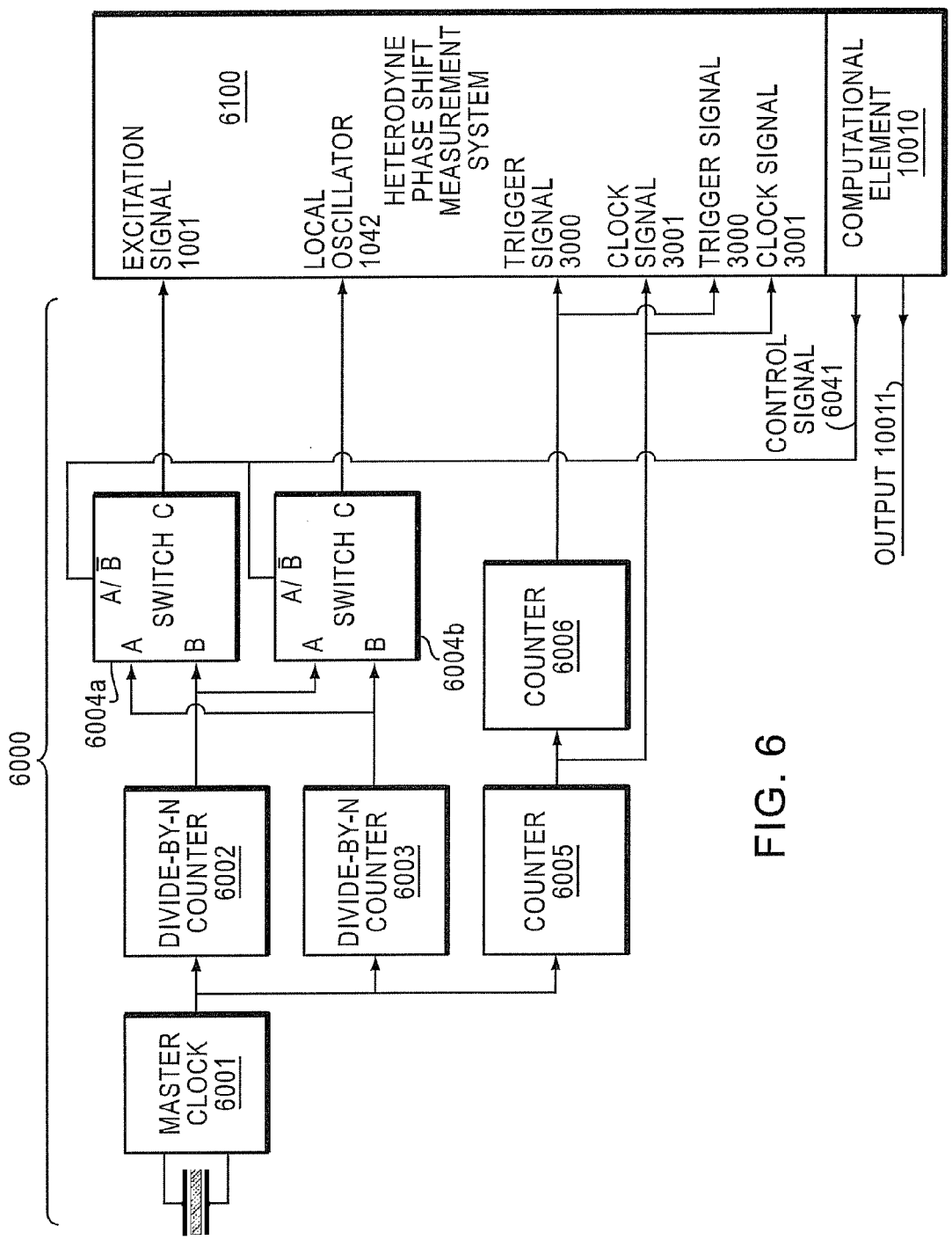
FIG. 6 is a schematic diagram showing a first example frequency generator used in conjunction with the demodulation element of FIG. 3.

FIG. 6 is a schematic diagram showing a first example frequency generator 6000 used in conjunction with the demodulation element of FIG. 3. The frequencies generated in this embodiment may be obtained by division the frequency $f_0$ of a single master clock, 6001, which may be a quartz crystal-controlled oscillator. This frequency is divided by two divide-by-N counters 6002, 6003, each of which may be followed by a divide-by-two stage (not shown) so that the output is guaranteed to be a square wave. The output frequencies of these components are $f_0/2N_1$ and $f_0/2N_2$, respectively. The difference between these frequencies is $(f_0/2)(1/N_1 - 1/N_2)$ and when $N_2 = N_1 + 1$, that becomes $f_0/2N_1N_2$. Assume that $N_1$ is odd and $N_2$ is even and divisible by 3. Then, $2N_2$ is divisible by 12, so the combination of counters 6005 and 6006 having divisors $N_1$ and $2N_2$, respectively, meets the above noted goals for signals 3000 and 3001 of the demodulator element shown in FIG. 3.

The element denoted as 6100 in FIG. 6 represents the components of the heterodyne phase shift measurement system shown in FIG. 1, with demodulators 1008, 1008' being implemented by the components shown in FIG. 3. The outputs of counters 6002, 6003 may be selectively interchanged by the switch 6004, under control of the computational element 10010, which generates a control signal 6041, to create excitation signal 1001 and local oscillator signal 1042 used in the system shown in FIG. 1. The computational element 10010 may further implement operations i, ii, and iii given above, to measure the gross phase shift with $f_{lo} < f_x$, measure the gross phase shift with $f_{lo} > f_x$, keeping $|f_{lo} - f_x|$ the same, and take half of the difference between these measurements.

Embodiment 2

In certain applications, it may be desirable to modify the frequency generation techniques of Embodiment 1. For example, if the physical system under study has a narrow resonance (e.g., if it is a quartz crystal), even the modest change in the excitation frequency that Embodiment 1 may produce may be undesirable. And, because $f_r$ increases rapidly with decreasing divisors $N_1$ and $N_2$, operation at high excitation frequencies may suggest a very high $f_o$ to keep $f_r$ in the desired range. These issues may be addressed when one of the two high frequency signals (i.e., $f_x$ or $f_{lo}$) is generated from the other using a serrodyne frequency offset generator.

A serrodyne frequency offset generator subjects a signal at frequency F to phase modulation $\phi(t)$ by a sawtooth waveform having $2\pi$ radians maximum phase shift. Because the maximum phase shift is $2\pi$, the resulting phase modulated waveform is continuous at the transitions where the phase resets from $2\pi$ to 0, and the frequency of the phase modulated signal is $F + d\phi/dt$.

Figure 7:
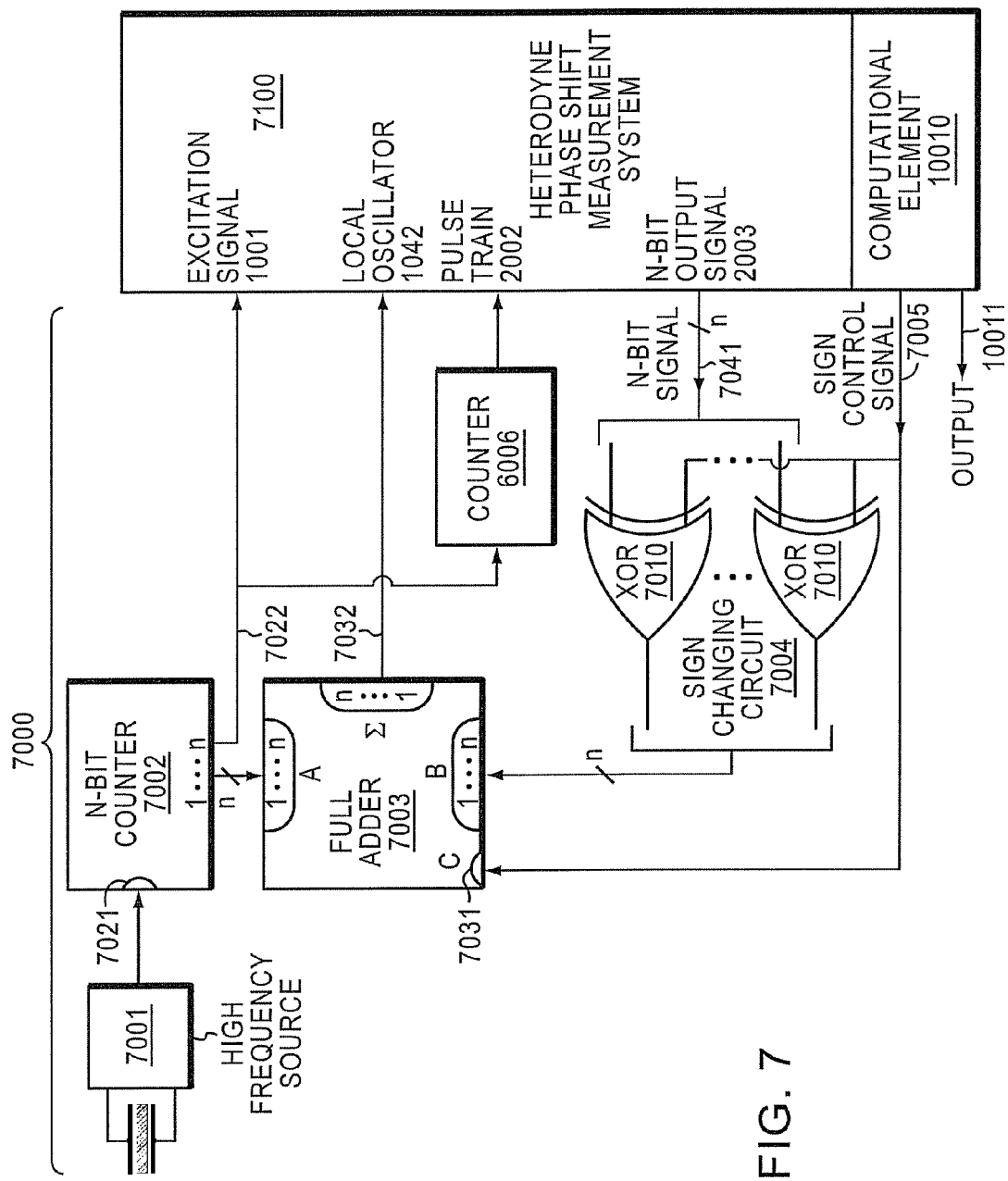
FIG. 7 is a schematic diagram showing a second example frequency generator that uses a serrodyne frequency offset generator for the local oscillator signal used in conjunction with the demodulation element of FIG. 2.

FIG. 7 is a schematic diagram showing a second example frequency generator 7000 that uses a serrodyne frequency offset generator for the local oscillator signal, in conjunction with the demodulation element of FIG. 2. A source 7001, at frequency $f_o$, is provided to the clock input port 7021 to an N-bit counter 7002, the highest bit of which produces a square wave 7022 at frequency $f_o/2^N$. For example, using N=4, the frequency of square wave 7022 is $f_o/16$.

All N of the bits of counter 7002 are provided to the A inputs 1 . . . n of a full-adder circuit 7003, the B inputs 1 . . . n are coupled to an N-bit integer signal 7041 that has passed through a sign change circuit 7004 comprising N XOR gates 7010. The output of the full-adder 7003 is $\Sigma = A + B + C_i$, where $C_i$ is a carry input (either 0 or 1). The carry output may not be used. Note that the negative of a 2s-complement binary number is the 1s-complement plus 1. When the sign control signal 7005 is high (true), the XOR gates 7010 output the 1s-complement of their input. The sign control signal 7005 also is tied to the carry input port 7031 of the full-adder 7003. Thus, the full-adder 7003 either adds or subtracts the supplied integer from the contents of counter 7002 according to the state of the sign control signal 7005.

Observe that when a positive number is added to the contents of counter 7002, the transitions of its highest bit occur earlier in the cycle, and when it is subtracted, the transitions occur later. Thus, the highest bit output of adder 7003 is a phase modulated version of the signal 7022 produced by N-bit counter 7002. If integer 7041 continuously increases, the highest bit output of the adder 7032 is a frequency offset version of signal 7022, the sign of the offset being determined by the state of sign control line 7005, and the magnitude being the frequency of the highest bit of integer 7041.

Signal 7022 also is supplied to a counter 7006, which is used as a frequency divider. The output of the counter 7006 can be used as the pulse train input 2002 to the digital counter 2000 shown in FIG. 2. That digital counter 2000 provides an N-bit output signal 2003 that is used as N-bit signal 7041, the phase modulation input to the serrodyne frequency offset generator. Thus, the circuitry described in relation to FIG. 7 above provides all the necessary signals for the example phase shift measurement system of FIG. 1, using the example demodulator element of FIG. 2. Computational element 10010 performs operations i, ii, and iii set out above, and also generates the sign control signal 7005.

Embodiment 3

Figure 8:
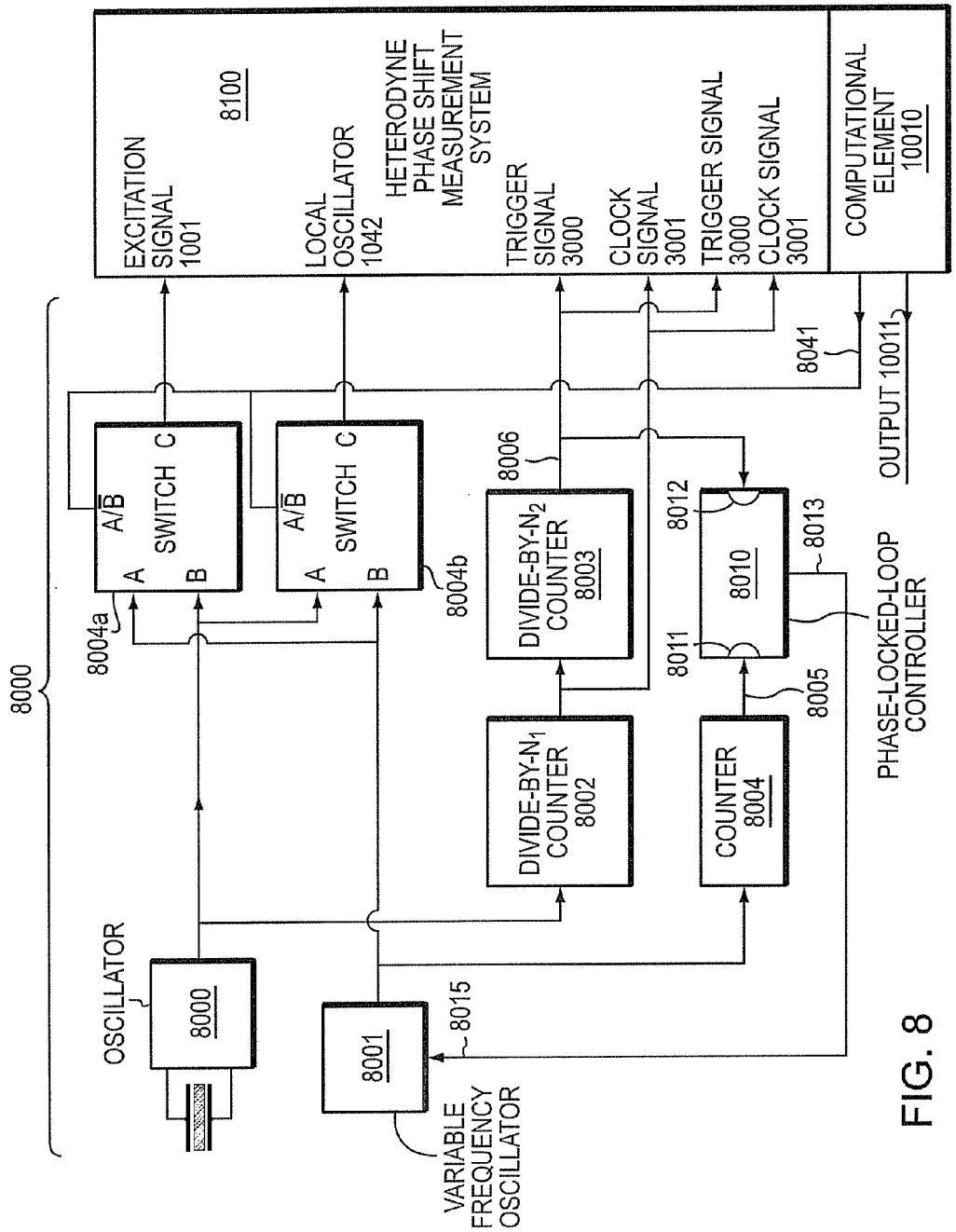
FIG. 8 is a schematic diagram showing a third example frequency generator that uses a phase-locked loop for frequency offset generation in conjunction with the demodulation element of FIG. 3.

There may be applications where such a high excitation frequency, $f_x$, is desired that even the modest frequency division resulting from the counter 7002 of Embodiment 2 is undesirable. In those cases, an embodiment based on a phase-locked-loop may be preferred. FIG. 8 is a schematic diagram of a third example frequency generator 8000 using a phase-locked loop for frequency offset generation and in conjunction with the demodulation element of FIG. 3. As shown in FIG. 8, the output of an oscillator 8000 is used directly as $f_x$ as well as the clock input of a divide-by-$N_1$ counter 8002, the output of which is used as the clock signal 3001 of the example demodulator shown in FIG. 3, and also is sent to a further divide-by-$N_2$ counter 8003. The output of the divide-by-$N_2$ counter 8003 is at frequency $f_r$, and is sent as trigger signal 3000.

A variable frequency (typically, voltage controlled) oscillator 8001 may be used to generate the local oscillator signal. This is divided using a second counter 8004b, having division ratio $N_3=N_1*N_2+1$, and the output signal 8005 of which is supplied to the input port 8011 of a phase-locked-loop controller 8010. The other input port 8012 of phase-locked-loop controller 8010 may receive an output signal 8006 from the a divide-by-$N_2$ counter 8003, at frequency $f_r$. Thus, $f_x=N_1*N_2*f_r$ and $f_{lo}=(N_1*N_2+1)*f_r$, $f_r=f_x-f_{lo}$, which is the desired value.

The phase-locked-loop operates by detecting the phase difference between its two inputs and adjusting the voltage sent to the voltage controlled oscillator to cause that phase difference to reach a stationary value such as 0 or $\pi/2$ radians.

Apart from the use of a phase-locked-loop, this embodiment may operate in a similar same manner as Embodiment 1. Interchanging the excitation and local oscillator lines, using switches 8004a and 8004b, as in Embodiment 1 is the preferred technique for frequency switching.

This embodiment may be preferred when the highest possible excitation frequency is desired, but in other respects Embodiments 1 and 2 may be preferred. The reason for this is that the voltage controlled oscillator may trade off frequency stability for tunability, and since the excitation signal and local oscillator signal are independent and distinct, any instability of the local oscillator signal may appear directly as noise in the measured phase shift.

While the above description discusses various embodiments, it should be apparent that a number of modifications and/or additions may be made without departing from the invention's intended spirit and scope. For example, the above described techniques may be implemented in software, in hardware, or in a combination thereof. A software implementation may include computer-executable instructions stored in a computer-readable storage medium, for example a CD, a DVD, a hard-disk, a solid-state storage device, a volatile storage device, or other tangible medium. A hardware implementation may include processors, memories, programmable logic circuits, application specific integrated circuits, and/or other types of hardware components. Further, a combined software/hardware implementation may include both computer-executable instructions embodied in a computer-readable medium, as well as one or more hardware components. Accordingly, it should be understood that the above descriptions are meant to be taken only by way of example.

What is claimed is:

1. An apparatus for measuring a phase shift in a physical system excited by an excitation signal, comprising:
    a frequency generator configured to produce the excitation signal having a excitation frequency ($f_x$), a local oscillator signal having a local oscillator frequency ($f_{lo}$), and a reference signal, where the reference signal has a difference frequency that is $f_x-f_{lo}$;
    a mixer configured to detect an output of the physical system in response to the excitation signal and mix the output with the local oscillator signal;
    a filter configured to select a difference frequency component of output of the mixer; and
    a computational element configured to:
        cause $f_x$, or the $f_{lo}$, or both, to vary such that $|f_x-f_{lo}|$ is constant, but a relationship between $f_x$ and $f_{lo}$ changes from $f_{lo}<f_x$ to $f_{lo}>f_x$,
        measure a phase shift of the difference frequency component with respect to the reference signal while $f_{lo}<f_x$ to produce a first measurement, and while $f_{lo}>f_x$ to produce a second measurement, and
        subtract the second measurement from the first measurement, and divide in half, to produce a phase shift result.

2. The apparatus as in claim 1, wherein the frequency generator is configured to produce the local oscillator signal, the excitation signal, and the reference signal such that during a complete cycle of the reference signal both the excitation signal and the local oscillator signal have an integer number of complete cycles.

3. The apparatus as in claim 1, wherein the frequency generator comprises a master clock from which the excitation signal, the local oscillator signal and the reference signal are generated by frequency division.

4. The apparatus as in claim 1, wherein the frequency generator comprises a serrodyne difference frequency generator configured to generate at least one of the excitation signal, the local oscillator signal and the reference signal.

5. The apparatus as in claim 1, wherein the frequency generator comprises a phase lock loop configured to generate at least one of the excitation signal, the local oscillator signal and the reference signal.

6. The apparatus as in claim 1, further comprising:
    at least one demodulator element configured to receive the difference frequency component and the reference signal and operate in conjunction with the computational element to produce the phase shift result.

7. The apparatus as in claim 6, wherein the at least one demodulator element includes a digital counter coupled to a demultiplexer, that is in turn coupled to a counter array.

8. The apparatus as in claim 6, wherein the at least one demodulator element includes first and second digital timers coupled to first and second counters respectively.

9. The apparatus as in claim 1 wherein the filter is a low-pass filter implemented by an amplifier.

10. A method for measuring a phase shift in a physical system excited by an excitation signal, comprising:

generating an excitation signal having a frequency ($f_x$), a local oscillator signal having a frequency ($f_{lo}$), and a reference signal having a difference frequency that is $f_x-f_{lo}$;

applying the excitation signal to the physical system to produce a response signal;

mixing, at a mixer, the response signal with the local oscillator signal to produce an output signal;

selecting a difference frequency component of the output signal;

varying $f_x$, or $f_{lo}$, or both, such that $|f_x-f_{lo}|$ is constant, but a relationship between $f_x$ and $f_{lo}$ changes from $f_{lo}<f_x$ to $f_{lo}>f_x$;

measuring a phase shift of the difference frequency component with respect to the reference signal while $f_{lo}<f_x$ to produce a first measurement, and while $f_{lo}>f_x$ to produce a second measurement; and using half of a difference between the second measurement and the first measurement as a phase shift result.

11. The method as in claim 10, wherein the generating produces the local oscillator signal, the excitation signal, and the reference signal such that during a complete cycle of the reference signal both excitation signal and local oscillator signal have an integer number of complete cycles.

12. The method as in claim 10, wherein the generating generates the excitation signal, the local oscillator signal and the reference signal by frequency division.

13. The method as in claim 10, wherein the generating generates at least one of the excitation signal, the local oscillator signal and the reference signal by serrodyne difference frequency generation.

14. The method as in claim 10, wherein the generating generates at least one of the excitation signal, the local oscillator signal and the reference signal using a phase lock loop.

15. A method for measuring a phase shift in a physical system excited by an excitation signal, comprising:

causing variation, by a computational element, of a frequency ($f_x$) of the excitation signal, or a frequency ($f_{lo}$) of a local oscillator signal, or both, such that $|f_x-f_{lo}|$ is constant, but a relationship between $f_x$ and $f_{lo}$ changes from $f_{lo}<f_x$ to $f_{lo}>f_x$;

measuring a phase shift of a difference frequency component, obtained from application of the excitation signal to the physical system with respect to a reference signal while $f_{lo}<f_x$ to produce a first measurement, and while $f_{lo}>f_x$ to produce a second measurement; and using a difference between the second measurement and the first measurement in determining a phase shift result.

16. The method as in claim 15, further comprising:
generating the excitation signal;
generating the local oscillator signal; and
generating the reference signal, such that during a complete cycle of the reference signal both the excitation signal and the local oscillator signal have an integer number of complete cycles.

17. The method as in claim 15, further comprising:
applying the excitation signal to the physical system to produce a response signal;
mixing the response signal with the local oscillator signal to produce an output signal; and
selecting the difference frequency component of the output signal.

18. An apparatus for measuring a phase shift in a physical system excited by an excitation signal, comprising:

means for varying a frequency ($f_x$) frequencies of the excitation signal, or a frequency ($f_{lo}$) of a local oscillator signal, or both, such that $|f_x-f_{lo}|$ is constant, but a relationship between $f_x$ and $f_{lo}$ changes from $f_{lo}<f_x$ to $f_{lo}>f_x$;

means for measuring a phase shift of a difference frequency component obtained from application of the excitation signal to the physical system with respect to a reference signal while $f_{lo}<f_x$ to produce a first measurement, and while $f_{lo}>f_x$ to produce a second measurement; and means for using half of a difference between the second measurement and the first measurement as a phase shift result.

19. The apparatus as in claim 18, further comprising:
means for generating the excitation signal;
means for generating the local oscillator signal; and
means for generating the reference signal, such that during a complete cycle of the reference signal both the excitation signal and the local oscillator signal have an integer number of complete cycles.

20. The apparatus as in claim 19, further comprising:
means for applying the excitation signal to the physical system to produce a response signal;
means for mixing the response signal with the local oscillator signal to produce an output signal; and
means for selecting the difference frequency component of the output signal.

* * * * *

UNITED STATES PATENT AND TRADEMARK OFFICE
CERTIFICATE OF CORRECTION

PATENT NO. : 8,364,430 B2  Page 1 of 1
APPLICATION NO. : 12/434419
DATED : January 29, 2013
INVENTOR(S) : Paul L. Kebabian It is certified that error appears in the above-identified patent and that said Letters Patent is hereby corrected as shown below:

In the Specifications:

Col. 4, line 16 should read:
supplied on output port 2006 steps through all ~~22~~ $\underline{2^N}$ possible Col. 5, line 47 should read:
digital timer 3031 is a multiple, ~~No~~$\underline{N_0}$, of the reference fre- Col. 5, line 48 should read:
quency $f_r$, and therefore the time axis is scaled as 0 to ~~No~~$\underline{N_0}$.

In the Claims:

Col. 12, line 19, claim 18 should read:
means for varying a frequency ($f_x$) ~~frequencies~~ of the exci- Signed and Sealed this
Second Day of July, 2013

Teresa Stanek Rea
*Acting Director of the United States Patent and Trademark Office*